United States Patent
Knuutila et al.

(10) Patent No.: US 7,158,489 B1
(45) Date of Patent: Jan. 2, 2007

(54) DATA TRANSMISSION IN A TDMA SYSTEM

(75) Inventors: Jarno Knuutila, Tampere (FI); Jari Hämäläinen, Kangasala As (FI); Ari Aho, Tampere (FI); Markku Lipponen, Tampere (FI); Ari Salminen, Salo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/342,843

(22) Filed: Jun. 29, 1999

(30) Foreign Application Priority Data

Jun. 30, 1998 (GB) ................................. 9814080.9

(51) Int. Cl.
*H04B 7/185* (2006.01)
(52) U.S. Cl. ...................... 370/318; 370/321; 370/319; 455/522; 455/69
(58) Field of Classification Search ................ 370/345, 370/349, 468, 395.4, 476, 470, 230, 252, 370/338, 465, 442, 528, 395.1, 114.2, 318, 370/321, 311, 332, 331, 333–337; 455/69, 455/443, 522, 550, 115.1, 67.1, 114.3, 114.2, 455/550.1, 126, 456.5, 561, 575.1, 13.4, 455/424.425, 422.1, 9, 67.11, 67.13, 95, 226.1, 455/115.2, 117, 99, 256, 67, 14, 68, 226.4, 455/426, 115.3, 574, 572, 13.1, 513, 127, 455/115, 456.6, 67.14; 375/260, 264, 296, 375/295, 146, 135
See application file for complete search history.

(56) References Cited

U.S. PATENT DOCUMENTS

| 4,636,741 | A | * | 1/1987 | Mitzlaff ..................... 330/127 |
| 4,939,786 | A | * | 7/1990 | McCallum et al. ............ 455/67 |
| 5,101,175 | A | | 3/1992 | Vaisanen .................... 330/279 |
| 5,109,538 | A | | 4/1992 | Ikonen et al. ................. 455/89 |
| 5,118,965 | A | | 6/1992 | Vaisanen et al. ............. 307/261 |
| 5,152,004 | A | | 9/1992 | Vaisanen et al. .............. 455/68 |
| 5,164,884 | A | | 11/1992 | Pesola ........................ 361/386 |
| 5,204,643 | A | | 4/1993 | Verronen .................. 333/81 R |
| 5,214,309 | A | | 5/1993 | Saarnimo .................... 257/712 |
| 5,214,372 | A | | 5/1993 | Vaisanen et al. .............. 324/95 |
| 5,230,091 | A | | 7/1993 | Vaisanen ..................... 455/88 |
| 5,241,694 | A | | 8/1993 | Vaisanen et al. ............. 455/126 |
| 5,276,917 | A | | 1/1994 | Vanhanen et al. ............. 455/89 |
| 5,287,555 | A | * | 2/1994 | Wilson et al. .............. 455/115 |
| 5,291,147 | A | | 3/1994 | Muurinen .................... 330/136 |
| 5,333,175 | A | * | 7/1994 | Ariyavisitakul et al. ...... 379/58 |
| 5,369,789 | A | * | 11/1994 | Kosugi et al. .............. 455/126 |

(Continued)

FOREIGN PATENT DOCUMENTS

EP      0 800 282      10/1997

(Continued)

OTHER PUBLICATIONS

GSM 04.08 Version 4.19.1 ETS 300,557, Aug. 1997.*

(Continued)

*Primary Examiner*—Edward F. Urban
*Assistant Examiner*—Charles Chow
(74) *Attorney, Agent, or Firm*—Foley and Lardner LLP (57) ABSTRACT

In TDMA systems it is possible to transmit data on more than one consecutive slot per frame. This introduces increased workloads on the power amplifier of the transmitter of the mobile station. To prevent the power amplifier from overheating, temperature sensing means are incorporated into the mobile station which output to a control system comprising a comparator and feedback means which together regulate the operation of the transmitter if the power amplifier approaches or exceeds it upper rated operating value. Thereby preventing the power amplifier from damage.

45 Claims, 4 Drawing Sheets

U.S. PATENT DOCUMENTS

| | | | |
|---|---|---|---|
| 5,392,464 A | 2/1995 | Pakonen | 455/115 |
| 5,404,585 A | 4/1995 | Vimpari et al. | 455/115 |
| 5,432,473 A | 7/1995 | Mattila et al. | 330/133 |
| 5,434,537 A | 7/1995 | Kukkonen | 330/2 |
| 5,450,620 A | 9/1995 | Vaisanen | 455/127 |
| 5,493,255 A | 2/1996 | Murtojarvi | 330/296 |
| 5,519,886 A * | 5/1996 | Gilbert et al. | 455/115 |
| 5,530,923 A | 6/1996 | Heinonen et al. | 455/126 |
| 5,548,616 A | 8/1996 | Mucke et al. | 375/295 |
| 5,564,074 A | 10/1996 | Juntti | 455/67.1 |
| 5,675,611 A | 10/1997 | Lehtinen et al. | 375/297 |
| 5,697,074 A | 12/1997 | Makikallio et al. | 455/126 |
| 5,732,334 A * | 3/1998 | Miyak | 455/126 |
| 5,745,016 A | 4/1998 | Salminen | 333/17.1 |
| 5,752,172 A | 5/1998 | Matero | 455/127 |
| 5,774,797 A | 6/1998 | Kawano et al. | 455/127 |
| 5,786,728 A | 7/1998 | Alinikula | 330/149 |
| 5,815,820 A * | 9/1998 | Kiem et al. | 455/575 |
| 5,819,165 A | 10/1998 | Hulkko et al. | 455/126 |
| 5,854,971 A * | 12/1998 | Nagoya et al. | 455/126 |
| 5,884,149 A | 3/1999 | Jaakola | 455/103 |
| 5,914,959 A * | 6/1999 | Marchetto et al. | 370/468 |
| 6,006,093 A * | 12/1999 | Aalto et al. | 455/443 |
| 6,067,458 A * | 5/2000 | Chen | 455/522 |
| 6,072,788 A * | 6/2000 | Peterson et al. | 370/337 |
| 6,072,792 A * | 6/2000 | Mazur et al. | 370/345 |
| 6,091,741 A * | 7/2000 | Fujiwara et al. | 370/465 |
| 6,169,884 B1 * | 1/2001 | Funk | 455/67.1 |
| 6,240,073 B1 * | 5/2001 | Reichman et al. | 370/319 |

FOREIGN PATENT DOCUMENTS

| | | |
|---|---|---|
| FR | 0800282 A2 * | 8/1997 |
| GB | WO 96/33555 A1 * | 10/1996 |
| GB | 2339113 A * | 6/1999 |
| WO | WO 93/02505 | 2/1993 |
| WO | WO 96/33555 | 10/1996 |

OTHER PUBLICATIONS

ETS 300 557(GSM 04.08 version 4.19.1): Aug. 1997 pp. 39-52.

* cited by examiner

DATA TRANSMISSION IN A TDMA SYSTEM

BACKGROUND OF THE INVENTION

1. Field of the Invention

The present invention relates to a method and apparatus for data transmission by a mobile station in a Time Division Multiple Access (TDMA) system. More specifically, the invention concerns multi-slot transmission of data services in such a system.

2. Description of the Prior Art

TDMA is a fundamental digital telecommunication technology and forms the basis of cellular standards such as Global System for Mobile Communications (GSM). A TDMA system includes the basic subsystems of cellular radio systems including a switching network, base stations and mobile stations (MS). In a TDMA system the radio spectrum is divided into radio carrier frequencies typically spaced 30 kHz to 200 kHz apart. This spacing between the carrier frequencies is the nominal or effective bandwidth of the total multi-channel multiplexed signal. Digital techniques are employed at the base station and in the cellular radio to subdivide the time on each radio channel into time slots, i.e. the TDMA radio carrier waveform is divided into several different types of control and voice/data channels by the use of different time slots or shared portions of time slots. Time slots are the smallest individual time periods available to each mobile station. Each time slot can be assigned to a different mobile telephone, and the time slots can be dedicated or dynamically assigned. Voice or data information as well as access information are converted to digital information that is sent and received in bursts during the time slots. The burst of digital information can be encoded, transmitted, and decoded in a fraction of the time required to produce the sound. Therefore, only a fraction of the airtime is used by one channel, and other subscribers can use the remaining time slots on the radio channel. The result is that TDMA systems allow several mobile stations (MS) to operate simultaneously on a single radio carrier frequency because the mobile stations share the radio frequency by dividing their signals into slots.

In the GSM system, eight mobile telephones are able to share a single 200 kHz bandwidth radio carrier waveform for voice or data communications. OSM uses a type of radio channel called a traffic channel (TCH) which carries voice, data, and control information. The TCH is organized into frames and time slot bursts, The entire repeating pattern of time slots is called a frame and comprises eight time slots assigned to eight different users. From each frame, each user is assigned to a particular time slot burst for reception, and a particular corresponding burst for transmission. Hence, GSM multiplexes (time shares) several users onto a single radio carrier frequency through use of distinct time slots from each frame to individual users. Thus the GSM radio channel structure allows multiple mobile stations to communicate on the same frequency by using different time slots on the radio channel.

As is well understood, such intensified use of radio spectrum greatly multiplies subscriber capacity. A further advantage of digital cellular technology is its ability to support advanced high speed data services such as short message service (SMS), broadcast paging, imaging services and fax transmission.

Data services ordinarily are communicated in the same way as voice signals, that is they are assigned a particular individual time slot in a frame and share the single bandwidth radio carrier with other users, However, whilst the transfer of voice signals must be on a real time basis (instantaneous), certain data services can be transferred on a non-real time basis (stored or delayed). For example because paging messages can be delayed for several minutes without significant disadvantages to the receiver of the message, it allow s short paging messages to be placed in a queuing system. Voice services on the other hand cannot queue an incoming call for more than a few seconds otherwise it is likely that the caller would terminate the call.

Non-real time operability of data services allows transmission of the information to be treated with increased flexibility. This has led recently to the development of multi-slot data transfer capability. Multi-slot transmission is facilitated by the network, typically the base station, which controls channel allocation to users. If more than one slot in a frame is available (for instance during a period of relative inactivity and the slots have not be allocated to other users) then the network may designate the available slots to the transfer of data services. Accordingly, the network will command the mobile station to transmit the data communication on more than one consecutive slot. The data can then be decoded from the multi-slot transmission in the network.

SUMMARY OF THE INVENTION

The present invention aims to address the problems arising from multi-slot transmission, and accordingly, in one aspect, provides a method for controlling a transmitter of a portable radio communication apparatus for communication in a radio communication network employing transmission by a plurality of carrier frequencies in frames each including a predetermined number of time slots, the transmitter transmitting data bursts during one or more of said time slots in a frame; the method comprising monitoring at least one criterion associated with heat generated by the transmitter, providing a signal responsive to the at least one monitored criterion for controlling at least one output criterion of the transmitter.

It has been noted by the present inventors that current design of mobile station transmitters would not be able satisfactorily to cope with multi-slot transmission. One particular drawback is that the output RF power amplifier in standard TDMA mobile stations are designed to transmit at a rate of one slot per frame. In multi-slot transmission, driving the power amplifier at increased rates introduces new design challenges. In particular, it has been anticipated that driving the power amplifier for multi-slot transmission will introduce problems due to thermal effects. Specifically, if the junction temperature of the RF power amplifier exceeds its upper rating, then this would cause changes in the amplifier's operating characteristics and could lead to irreversible damage.

One approach to this problem could be to increase the power amplifier capacity and introduce further heat sinks in the mobile station. However, this would necessitate an increase in the size of the mobile station, which would be undesirable given the general trend towards more compact mobile stations.

The present inventors have recognized that an alternative approach is to limit the power output of the power amplifier while continuing to transmit in multi-slot mode by controlling the maximum allowed output power levels.

The maximum allowed power output of a mobile station transmitter depends on its allocated power classification, which is network controlled. The network chooses the transmission power of the mobile station, and commands to regulate it are issued to the mobile station. The network determines the required mobile station transmission power through reception level measurements performed on the base station, taking into account the mobile station maximum transmission power as well as quality, measurements done by the network; this last parameter helps to ensure that transmission quality is kept above some acceptance threshold.

At the start of a connection, the network chooses the initial value of the transmission power. Because the equipment of the user may be changed without warning the operator (subscription is linked to the SIM (Subscriber Identity Module), not to the mobile equipment), this indication must be given at the beginning of each new connection based on the RF power capability, known as the transmission power class, which refers to the maximum power the mobile station is able to transmit. This information, is used for power control and handover preparation.

GSM has five power classmarks defining respective maximum output powers. Typical classes in GSM900 are class 2 for transportable mobile telephones (eg. vehicle-mounted equipment) with a maximum power output of 8 watts; hand portables are classified 3 through to 5 with maximum power outputs ranging from 5 to 0.8 watts.

While the ciassmark is sent by the mobile station in the initial message, at the beginning of the data transmission it may happen that the classmark changes during the transmission. An example of this is mobile equipment including a handheld part and a vehicle mounted part including an RF transmitter, with the possibility to connect and disconnect the two parts during a communication. Then the power class changes, and the new value must be provided to the network. To achieve this, a classmark change procedure must be executed. In the OSM specification the ciassmark change procedure is described in GSM 04.08 in section 3.4.10.

By means of the invention, if it is determined that the heat generated by the transmitter of the portable radio apparatus approaches or has for example exceeded a pre-determined limit, then the output of the transmitter is regulated to ensure that the transmitter remains safely within its operating range.

Instead of, and/or as well as, monitoring the temperature of the transmitter, it is possible to monitor the temperature of the portable radio communication apparatus itself, and then to regulate transmission based on this temperature reading.

Conveniently, maximum and/or minimum pre-determined limits could be set. Optionally, intermediate values can also be set.

In one embodiment, the method comprises controlling the output power of the transmitter based on the monitored temperature, preferably changing the portable radio communication apparatus power classmark when the monitored temperature exceeds a pre-determined upper limit. As a result, the power amplifier output of the transmitter is reduced so that the temperature of the power amplifier does not reach or exceed its rated value.

In a second embodiment, the method comprises controlling the number of data bursts transmitted on time slots in a frame, preferably decreasing the number of data bursts transmitted on time slots in a frame when the monitored temperature exceeds a pre-determined limit. Regulating the multi-slot transmission in this way protects the transmitter from overstretching its transmission capabilities.

If more than one heat generated determining criterion is monitored, then it is possible to provide more than one signal responsive to the monitored criteria, the signals then controlling respective output criteria of the transmitter.

It is preferred that the method is performed by the portable radio communication apparatus, which advantageously stores the pre-determined limits in memory registers. Hence the operation of the transmission of the transmitter can be controlled by the portable radio communication apparatus automatically and independently from the network.

Optionally, the method can be performed by the radio communication network.

In a further aspect of the invention, there is provided a method for controlling a transmitter of a portable radio communication apparatus for communication in a radio communication network employing transmission by a plurality of carrier frequencies in frames each including a predetermined number of time slots, the transmitter transmitting data bursts during one or more of said time slots in a frame, the method comprising monitoring the number of data bursts transmitted on time slots in a frame, comparing the monitored number with a pre-determined limit, and changing the operation of the transmitter if the monitored number falls outside the pre-determined limit.

According to this aspect of the invention, if it is determined that the transmitter of the portable radio apparatus has for example exceeded a pre-determined limit of data bursts in a particular frame, then the operation of the transmitter can be regulated to account for this and adjusted accordingly.

In a preferred embodiment, the monitoring of the number of data bursts transmitted on time slots in a frame is performed over a predetermined period of time or pre-determined number of frames.

If the monitored number of transmitted data bursts exceeds a pre-determined limit then the output power of the transmitter can be decreased, advantageously by changing the classmark of the portable radio communication apparatus. As a result, the maximum available output power amplifier output of the transmitter is reduced so that the temperature of the power amplifier does not reach or exceed its rated value.

This class mark change can occur either in the call set-up or during high speed data transmission typically, but not restricted to, the moment when the number of used time slots is down or upgraded, or the temperature of the transmitter will reach a given limit.

The invention includes a method for controlling a transmitter of a portable radio communication apparatus, the portable radio communication apparatus communicating with a radio communication network over a radio channel comprising a plurality of time slots, and the transmitter transmitting data bursts during one or more of said time slots, the method comprising monitoring the transmission power level and comparing the monitored transmission power level with a pre-determined limit and changing the transmission power level of the communication apparatus based on the monitored transmission power level.

By continually monitoring the transmission power level, and comparing this with pre-determined values, the transmission level of the portable radio communication apparatus can be dynamically optimized.

The invention extends to radio systems and portable radio communication apparatus comprising means for performing the methods as described herein.

BRIEF DESCRIPTION OF THE DRAWINGS

The invention will now be described by way of example, with reference to the accompanying drawings in which.

DESCRIPTION OF THE PREFERRED EMBODIMENTS

Figure 1:
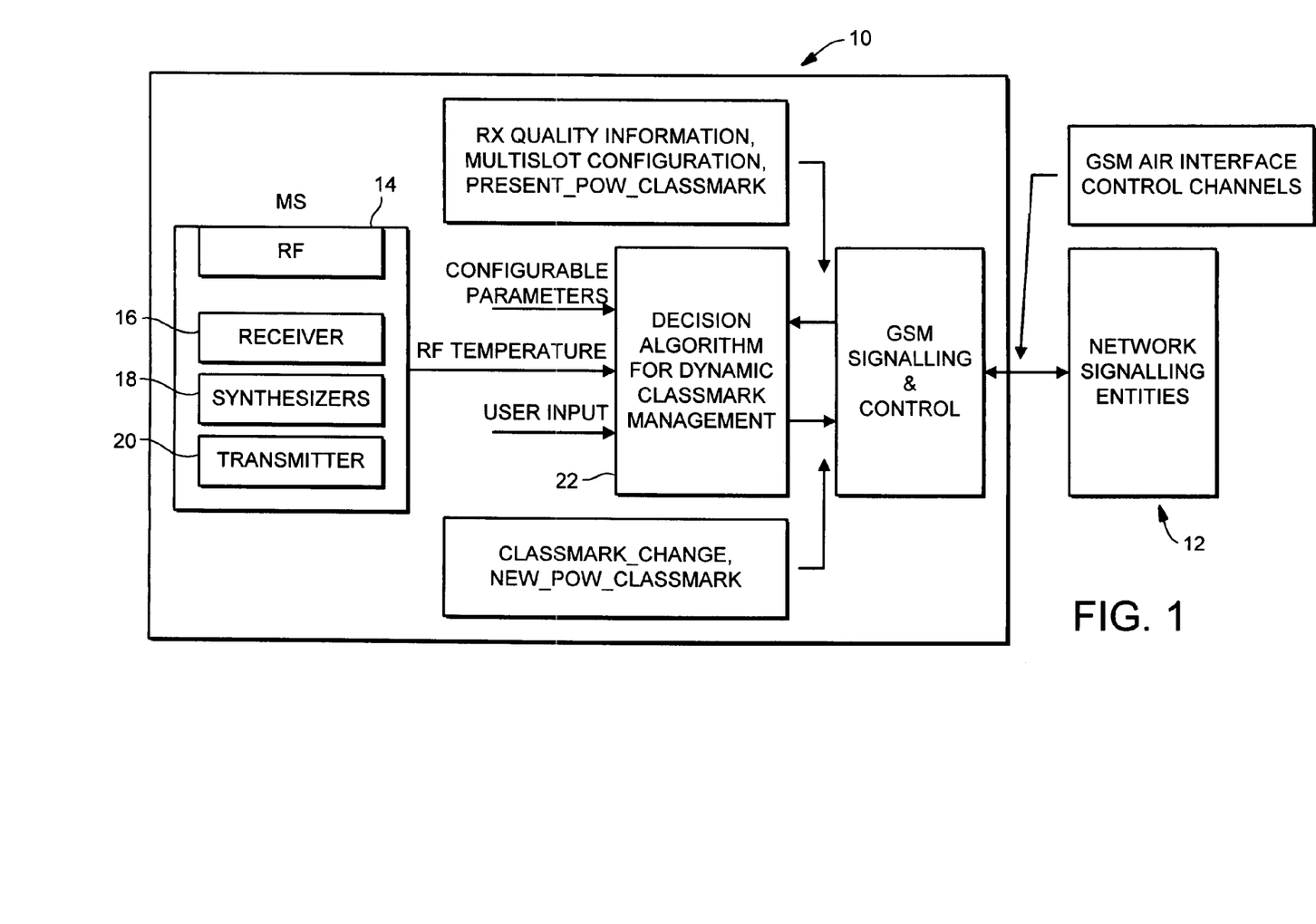
FIG. 1 is a block diagram of one embodiment of the present invention.

In the block diagram cellular telephone system shown in FIG. 1, a mobile station 10 communicates with the network 12, transferring data and digitized voice signals in a two way radio communication link. The cellular network 12 typically comprises an array of base stations which are linked together either directly or indirectly via mobile switching centers, and which enable telephone calls to be routed between mobiles stations as well as landline telephones.

The mobile station 10 is equipped with the standard features associated with a mobile communication device: a keypad for dialling numbers, accepting a call, terminating a call, storing telephone numbers, and so on; a microphone for converting sound pressure waves into electrical signals, and a loudspeaker for converting electrical signals into sound pressure waves; an antenna for radiating electromagnetic waves at transmission frequencies during transmission, and during reception for converting received electromagnetic waves at reception frequencies into electrical signals. The mobile station 10 also includes an RF block 14 comprising a receiver 16, synthesizers 18 and a transmitter 20.

It has previously been explained that in a TDMA system, and in particular GSM, a recent development in data services has been that of multi-slot transmission, for example, approaches such as High Speed Circuit Switched Data (HSCSD) and General Packet Radio Services (GPRS). Briefly, HSCSD is based on the use of up to 8 time slots per TDMA frame for one communication, thus providing for higher data transmission speeds. Typical applications of HSCSD include, facsimile, file transfer, electronic mail, video and distribution services. GPRS provides high speed packet radio access for GSM mobile stations and routing protocols for the GSM network. The relevant GSM standards of HSCSD and GPRS are GSM 02.34, 03.34 and GSM 03.64 respectively.

In a multi-slot transmission operation, the transmitter 20 outputs on more than one time-slot per TDMA frame. The power amplifier of the transmitter accordingly is driven at an increased rate compared to normal transmission at one slot per frame. This leads to an increase in the operating temperature of the power amplifier. If multi-slot transmission is sustained the temperature of the power amplifier will continue to rise. If unchecked, the rise in operating temperature of the power amplifier will cause damage to it.

Thus in one embodiment of the present invention the transmitter power amplifier (or adjacent area) is provided with a temperature sensor 21 (see FIG. 2) for monitoring the temperature of the transmitter 20, and in particular the power amplifier. The temperature sensor 21 continually takes a reading of the temperature of the transmitter and feeds this reading, either continually or periodically, to a dynamic classmark control system 22 which includes an algorithm for deciding the operation of the transmitter. Specifically, the algorithm can decide the maximum allowed output power level and/or the maximum allowed number of transmitted bursts per TDMA frame.

Figure 2:
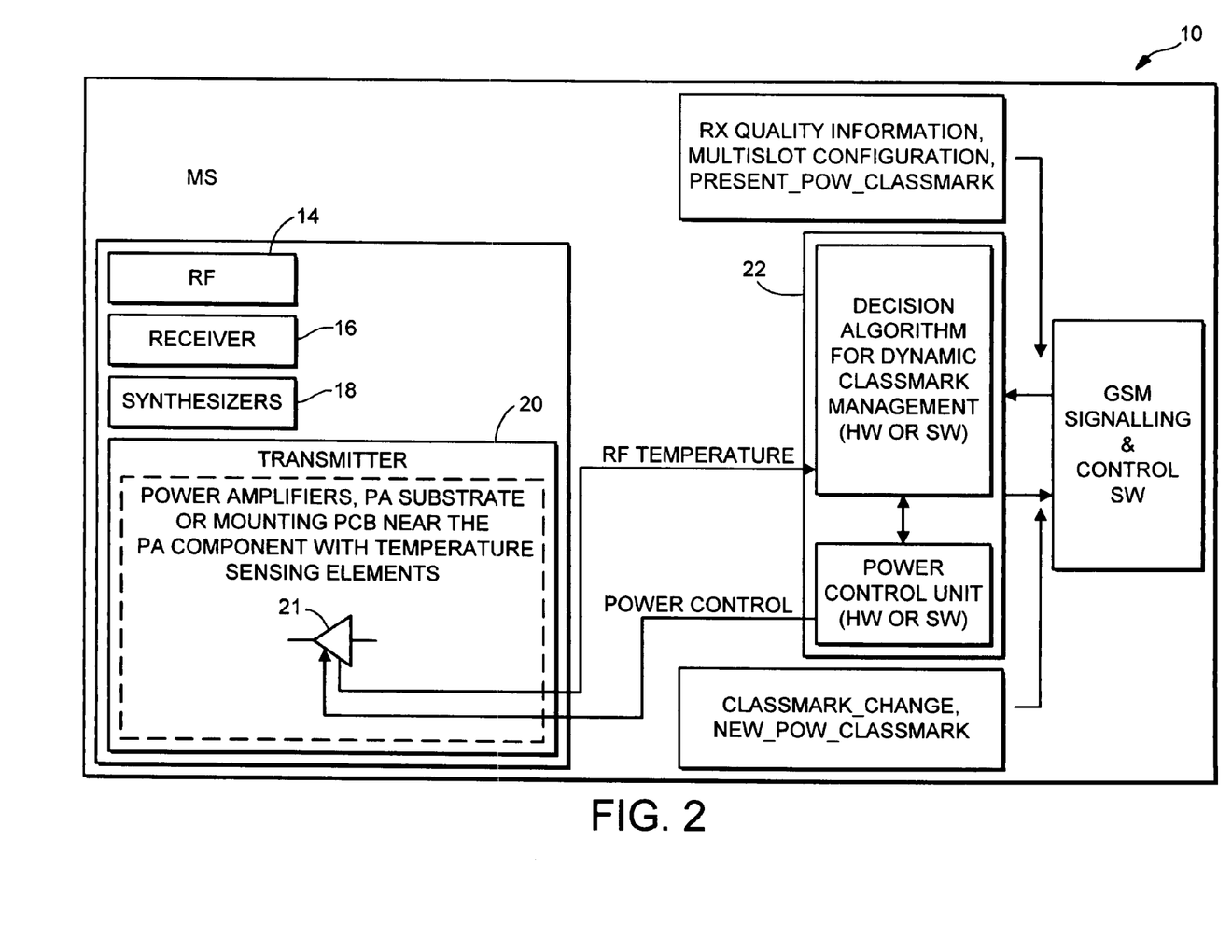
FIG. 2 is a block diagram illustrating in greater detail the embodiment of FIG. 1.

The control system 22 stores certain system parameters and operating characteristics, such as information about the power amplifier including operating temperature limits and pre-defined maximum transmission power levels. Such information is stored in the mobile station's non-volatile memory area or hardware registers. This would normally be factory set, but could be user defined. The control system 22 further includes a comparator which takes the sensed temperature reading and compares this against the stored preferred operating temperature range of the power amplifier. On the basis of the result of the comparator, the control system 22 decides whether or not to change the maximum allowed power output or the burst rate at which the power amplifier is being driven. If the result from the comparator is that the sensed temperature of the power amplifier is within its operating range, then the control system 22 directs no changes in the normal transmitter operation. If however the sensed temperature is outside its preferred operating range, then the control system 22 commands a change in the operation of the transmitter to ensure that the upper working limit of the power amplifier is not reached.

One approach is that it is the mobile station power classmark that is dropped, as a result reducing the maximum allowed power output of transmitter and thereby demanding less from the power amplifier. Another approach is that the number of multi-slot transmissions per frame is decreased. This is particularly beneficial where a drop in the power classmark could risk losing the connection altogether.

Figure 3:
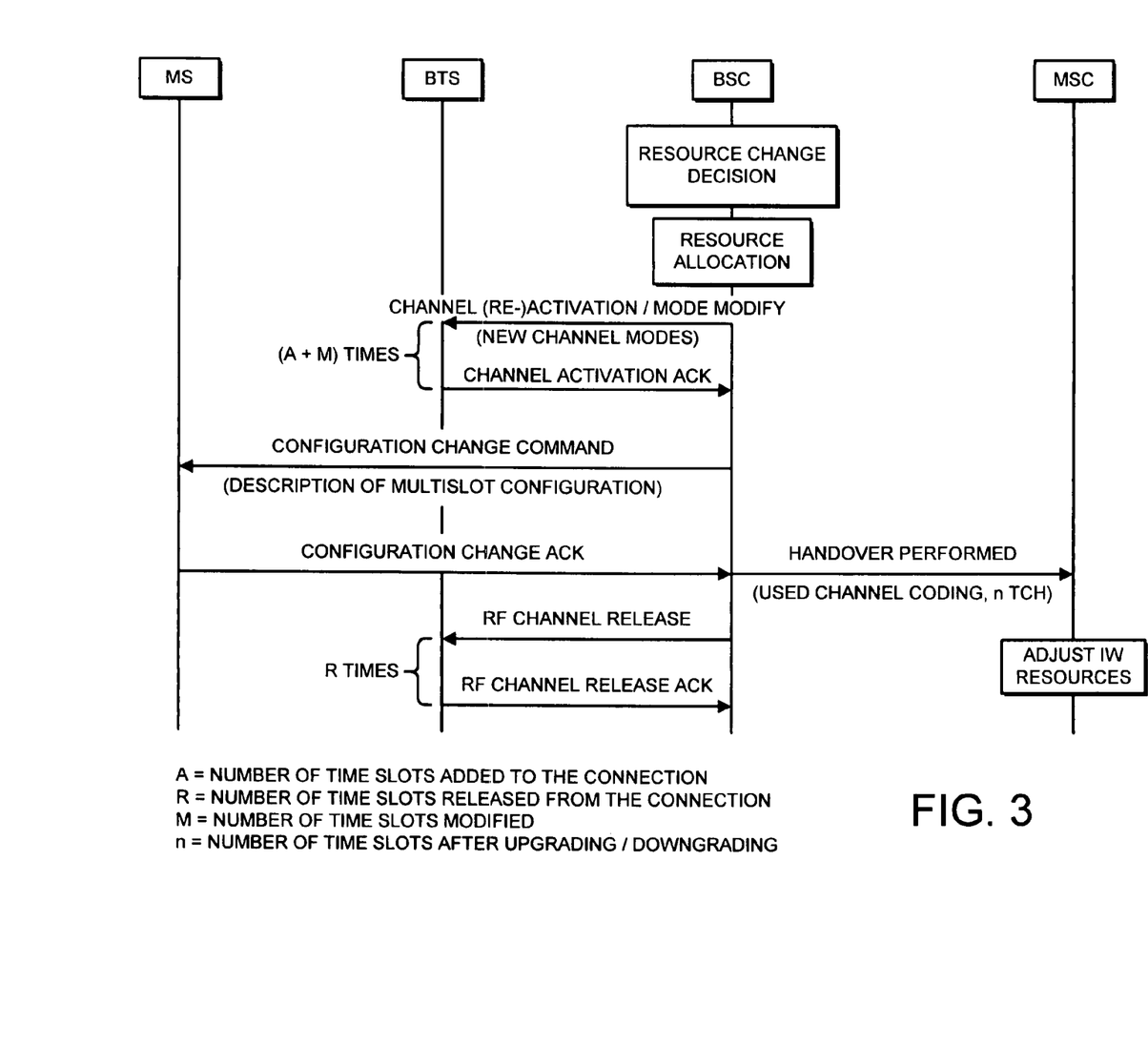
FIG. 3 is a schematic diagram of network originated resource upgrading in HSCSD.
Figure 4:
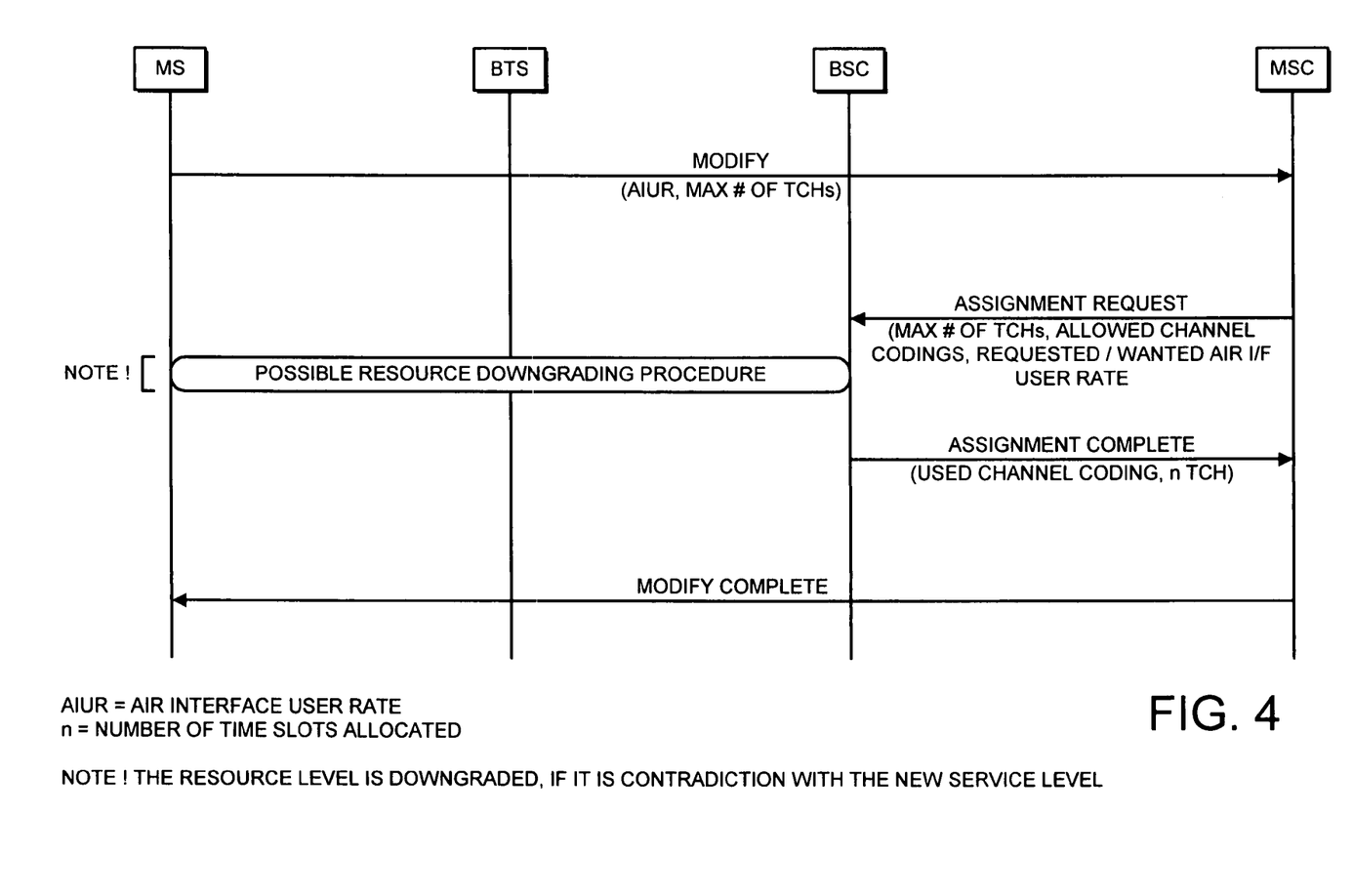
FIG. 4 is schematic diagram of user initiated service level up and downgrading.

In and HSCSD operation, typically the right moment for classmark change is after the resource upgrading procedure, which can be initiated either by the network or on the mobile station side. The implementation is mainly adding control entity for taking care of the mobile station classmark during the data transmission operation. FIGS. 3 and 4 illustrate HSCSD operation.

In the GPRS communication, the mobile station delivers its Mobile Radio Capabilities, including information about its power class, in an Attach procedure. This procedure is carried out when the mobile station initiates the GPRS "session". This information is stored in the Serving GPRS Support Node (SGSN) and the SGSN delivers it to the base station system when the mobile moves around the network. The Mobile Radio Capability information is provided to the SGSN by the mobile station also in the Routing Area Update, i.e. when the mobile station is moving around the network. It is also possible that the Mobile Radio Capability information is delivered by the mobile station to the base station when the mobile station enters the GPRS transfer mode, i.e. every time the mobile is going to send or receive data and when the physical radio channel is needed. This can be done for example in the Packet Resource Request message that is transmitted on the Packet Associated Control Channel (PACCH). These kinds of messages may be transmitted on the channel given for the mobile station, instead of user data messages. This procedure allows the mobile station to change its power class dynamically during the GPRS "session".

In a second embodiment, a direct temperature sensor is no longer employed, and the temperature of the transmitter is determined or estimated by indirect means. In this embodiment, a transmission monitor is provided for counting the number of consecutive multi-slot time slot transmissions effected by the transmitter. The monitor also counts the number of frames of multi-slot transmission. Accordingly, in a given time period, the total output burst rate of the power amplifier and the power dissipation which turns to heat can be continually determined and updated. The monitoring can be performed on a continually updating and dynamic basis. This can be fed into the control system 22 and compared with pre-defined operating values concerning the number of multi time slot transmissions over a certain number of frames. If the number of transmissions over a certain period of time is within the operating range of the power amplifier, then the control system 22 allows it to continue the transmission. However, if the counted transmission approaches or exceeds the upper limit of transmissions over a period of time or number of frames, (known to cause an unacceptable temperature rise of the transmitter, or mobile station when operating at high output power levels), then the control system 22 effects a change in the transmitter: either reducing the number of multi-slot transmissions or changing the mobile station power classmark.

For example, it may be that the transmitter is transmitting in GSM at a rate of 8 time slots per frame, the mobile station will have stored in a memory the number of frames in which 8 time slots can be transmitted on before the power amplifier begins to reach its critical limit. This information is used by the control system in determining the operation of the transmitter. It will be understood that a power amplifier operating at 8 time slots per frame will reach its critical limit sooner than if it was operating at say only 4 time slots per frame. Equally, at 4 time slot transmissions per frame the power amplifier can output a greater number of consecutive frames at this rate than operating at 8-time slot transmission per frame before approaching its critical value. These critical values are stored in an on-board memory facility which either can be readily accessed by the control system or form part thereof.

The control system ensures that the maximum allowed transmission power level (ie. the MS classmark or the number of bursts per TDMA frame) is according to the predefined criteria.

It should noted that whilst the feedback control systems of the invention have been described in the context of a portable radio communication device, such systems, and indeed aspects of the systems, can be implemented and supported in the network.

Furthermore, it will be readily understood that alternative arrangements to those described above with reference to the specific embodiment can be made within the inventive concept as defined in the appended claims.

Each feature disclosed in this specification (which term includes the claims) and/or shown in the drawings may be incorporated in the invention independently of other disclosed and/or illustrated features.

The appended abstract as filed herewith is included in the specification by reference.

What is claimed is:

1. A method for controlling a transmitter of a portable radio communication apparatus for communication in a radio communication network employing transmission by a plurality of carrier frequencies in frames each including a predetermined number of time slots, the transmitter transmitting data bursts during one or more of said time slots in a frame, the method comprising:
monitoring at least one criterion associated with heat generated by the transmitter; and
selectively adjusting an output of the transmitter in direct response to the at least one criterion associated with heat generated by the transmitter; and
wherein one of the at least one monitored criterion comprises the number of transmitted data bursts in a frame.

2. A method according to claim 1, wherein one of the at least one monitored criterion comprises the temperature of the transmitter.

3. A method according to claim 1, wherein the output of the transmitter comprises a power output of the transmitter.

4. A method according to claim 3, wherein if the monitored criterion exceeds a predetermined limit then the power output of the transmitter is decreased.

5. A method according to claim 4, wherein a maximum available power output of the transmitter is decreased by changing a power classmark of the portable radio communication apparatus.

6. A method according to claim 1, wherein the output of the transmitter comprises the number of data bursts transmitted in a frame.

7. A method according to claim 6, wherein if the monitored criterion exceeds a predetermined limit then the number of data bursts transmitted in a frame is decreased.

8. A method according to claim 1, wherein the monitoring step is performed by the portable radio communication apparatus.

9. A method according to claim 1, wherein the monitoring step is performed by the radio communication network.

10. A method according to claim 1, wherein the monitoring step is carried out during a transmission.

11. A method for controlling a transmitter of a portable radio communication apparatus for communication in a radio communication network employing transmission by a plurality of carrier frequencies in frames each including a predetermined number of time slots, the transmitter transmitting data bursts during one or more of said time slots in a frame, the method comprising monitoring the number of data bursts transmitted on time slots in a frame, comparing the monitored number of data bursts with a predetermined limit, and changing the operation of the transmitter to decrease transmission power level if the monitored number falls outside the predetermined limit.

12. A method according to claim 11, wherein the monitoring of the number of data bursts transmitted on time slots in a frame is performed over a predetermined period of time or predetermined number of frames.

13. A method according to claim 11, wherein changing the operation of the transmitter comprises controlling a power output of the transmitter.

14. A method according to claim 13, wherein controlling the power output of the transmitter comprises changing a power classmark of the portable radio communication apparatus.

15. A method according to claim 11, wherein changing the operation of the transmitter comprises controlling the number of data bursts transmitted on time slots in a frame.

16. A method according to claim 15, wherein controlling the number of data bursts transmitted on time slots in a frame comprises decreasing the number of data bursts transmitted on time slots in a frame if the monitored number of transmitted data bursts exceeds a predetermined limit.

17. A method according to claim 11, wherein the method steps are performed by the portable radio communication apparatus.

18. A method according to claim 11, wherein the method steps are performed by the radio communication network.

19. A method according to claim 11, wherein the monitoring is carried out during a transmission.

20. A method for controlling a transmitter of a portable radio communication apparatus for communication in a radio communication network employing transmission by a plurality of carrier frequencies in frames each including a predetermined number of time slots, the transmitter transmitting data bursts during one or more of said time slots, the method comprising:

monitoring a transmission power level of the communication apparatus; and comparing the monitored transmission power level with a predetermined limit and changing a maximum allowed transmission power level in response to the monitored transmission power level; and wherein the monitored transmission power level is compared with a predetermined power transmission level and if the monitored transmission power level is above said predetermined power transmission level then the maximum allowed output transmission power level is decreased by changing a power classmark of the portable radio communication apparatus.

21. A method according to claim 20, wherein the monitoring step is carried out during a transmission.

22. A radio telephone system comprising a portable radio communication apparatus for communication in a radio communication network employing transmission by a plurality of carrier frequencies in frames each including a predetermined number of time slots, the apparatus having a transmitter for transmitting data bursts during one or more of said time slots in a frame, the system including monitoring means for monitoring at least one criterion associated with heat generated by the transmitter, adjusting means for selectively adjusting the output of the transmitter in direct response to the at least one criterion associated with heat generated by the transmitter, wherein one of the at least one monitored criterion comprises the number of transmitted data bursts in a frame, wherein if the monitored criterion exceeds a predetermined limit then a power output of the transmitter is decreased.

23. A radio telephone system according to claim 22, wherein one of the at least one monitored criterion comprises the temperature of the transmitter.

24. A radio telephone system according to claim 22, wherein the output of the transmitter comprises the power output of the transmitter.

25. A radio telephone system according to claim 21, wherein a maximum available power output of the transmitter is decreased by changing a power classmark of the portable radio communication apparatus.

26. A radio telephone system according to claim 25, wherein one of the at least one output criterion comprises the number of data bursts transmitted in a frame.

27. A radio telephone system according to claim 25, wherein if the monitored criterion exceeds a predetermined limit then the number of data bursts transmitted in a frame is decreased.

28. A radio telephone system according to claim 22, wherein the portable radio communication apparatus includes the monitoring means.

29. A radio telephone system according to claim 22, wherein the radio communication network includes the monitoring means.

30. A radio telephone system according to claim 22, wherein the monitoring is carried out during a transmission.

31. A radio telephone system comprising a portable radio communication apparatus for communication in a radio communication network employing transmission by a plurality of carrier frequencies in frames each including a predetermined number of time slots, the apparatus having a transmitter for transmitting data bursts during one or more of said time slots in a frame, the system including monitoring means for monitoring the number of data bursts with a predetermined limit, and a processor for changing the operation of the transmitter to decrease a transmission power level if the monitored number of transmitted data bursts falls outside the predetermined limit.

32. A radio telephone system according to claim 31, wherein the monitoring means monitors the number of data bursts transmitted over a predetermined period of time or predetermined number of frames.

33. A radio telephone system according to claim 31, wherein the processor controls a power output of the transmitter.

34. A radio telephone system according to claim 33, wherein the processor controls the power output of the transmitter by changing a power classmark of the portable radio communication apparatus.

35. A radio telephone system according to claim 31, wherein the processor controls the number of data bursts transmitted on time slots in a frame.

36. A radio telephone system according to claim 35, wherein the number of data bursts transmitted on time slots in a frame is decreased when the monitored number of transmitted data bursts exceeds a predetermined limit.

37. A radio telephone system according to claim 31, wherein the portable radio communication apparatus includes the monitoring means, comparator and the processor.

38. A radio telephone system according to claim 31, wherein the radio communication network includes the monitoring means, comparator and the processor.

39. A radio telephone system according to claim 31, wherein the monitoring is carried out during a transmission.

40. A radio telephone system comprising a portable radio communication apparatus for communication in a radio communication network employing transmission by a plurality of carrier frequencies in frames each including a predetermined number of time slots, the apparatus having a transmitter for transmitting data bursts during one or more of said time slots in a frame, the system including monitoring means for monitoring a transmission power level of the transmitter and comparing means for comparing the monitored transmission power level with a predetermined limit and a processor for changing a maximum available transmission power level of the portable radio communication apparatus in response to the monitored transmission power level, wherein the monitored transmission power level is compared with a predetermined power transmission level and if the monitored transmission power level is above said predetermined power transmission level then a maximum allowed output transmission power level is decreased by changing the power classmark of the portable radio communication apparatus.

41. A radio telephone system according to claim 40, wherein the monitoring is carried out during a transmission.

42. A portable radio communication apparatus operable to communicate with a radio communication network employing transmission by a plurality of carrier frequencies in frames each including a predetermined number of time slots, the apparatus having a transmitter for transmitting data bursts during one or more of said time slots in a frame, and including monitoring means for monitoring at least one criterion associated with the heat generated by the transmitter, selectively adjusting the output of the transmitter in direct response to the at least one criterion associated with the heat generated by the transmitter to decrease the transmission power level, wherein one of the at least one monitored criterion comprises the number of transmitted data bursts in a frame.

43. A portable radio communication apparatus according to claim 42, wherein the monitoring is carried out during a transmission.

44. A method for controlling a portable radio communication apparatus for communication with a radio communication network employing transmission by a plurality of carrier frequencies in frames each including a predetermined number of time slots, the apparatus having a transmitter for transmitting data bursts during one or more of said time slots in a frame, the method comprising the steps of the apparatus registering a power classmark with the radio communication network, the portable radio communication apparatus monitoring at least one criterion associated with the heat generated by the transmitter, the apparatus sending a power classmark change request to the radio communication network responsive to the monitored criterion, and the radio communication network accordingly changing the power classmark of the portable radio communication apparatus wherein in one of the at least one monitored criterion comprises the number of bursts in a frame.

45. A method according to claim 44, wherein the monitoring step is carried out during a transmission.

* * * * *